United States Patent [19]
Su et al.

[11] Patent Number: 5,587,696
[45] Date of Patent: Dec. 24, 1996

[54] HIGH RESISTANCE POLYSILICON RESISTOR FOR INTEGRATED CIRCUITS AND METHOD OF FABRICATION THEREOF

[75] Inventors: Chung-Hui Su; Mong-Song Liang, both of Hsin-chu; Shou-Gwo Wuu, Hsinchu County; Chen-Jong Wang, Hsinchu, all of Taiwan

[73] Assignee: Taiwan Semiconductor Manufacturing Company Ltd., Hsin-Chu, Taiwan

[21] Appl. No.: 496,018

[22] Filed: Jun. 28, 1995

[51] Int. Cl.⁶ .................................. H01C 1/012
[52] U.S. Cl. .................. 338/314; 338/308; 338/204; 437/918; 29/610.1
[58] Field of Search ............... 338/306–308, 338/314, 204; 437/46, 191, 918; 29/610.1

[56] References Cited

U.S. PATENT DOCUMENTS

| | | | |
|---|---|---|---|
| 3,761,786 | 9/1973 | Imaizumi et al. | 437/46 |
| 3,879,236 | 4/1975 | Langdon | 437/918 |
| 3,947,866 | 3/1976 | Stellrecht | 257/543 |
| 3,984,822 | 10/1976 | Simko et al. | 437/46 |
| 4,178,674 | 12/1979 | Liu et al. | 437/191 |
| 4,647,900 | 3/1987 | Schelhorn et al. | 338/314 |
| 4,690,728 | 9/1987 | Tsang et al. | |
| 4,725,810 | 2/1988 | Foroni et al. | 338/226 |
| 5,024,972 | 6/1991 | DePinto et al. | 437/191 |
| 5,037,766 | 8/1991 | Wang | 437/918 |
| 5,164,338 | 11/1992 | Graeger et al. | 437/233 |
| 5,164,699 | 11/1992 | Smith et al. | 338/310 |
| 5,200,733 | 4/1993 | Davis et al. | 338/64 |
| 5,489,547 | 2/1996 | Erdeljac et al. | 437/918 |

Primary Examiner—Teresa J. Walberg
Assistant Examiner—Karl Easthom
Attorney, Agent, or Firm—George O. Saile; Alek P. Szecsy

[57] ABSTRACT

A multi-layer polysilicon resistor and a method by which the multi-layer polysilicon resistor is formed. A minimum of two polysilicon layers is formed upon an insulating layer, the insulating layer in turn being formed upon a semiconductor substrate. The first polysilicon layer is formed to a first thickness at a first deposition temperature. The second polysilicon layer is formed directly upon the first polysilicon layer. The second polysilicon layer is formed to a second thickness at a second deposition temperature. The two deposition temperatures are in the range of about 450 degrees centigrade to about 620 degrees centigrade, and the difference in temperature between the first deposition temperature and the second deposition temperature is a minimum of 10 degrees centigrade.

15 Claims, 3 Drawing Sheets

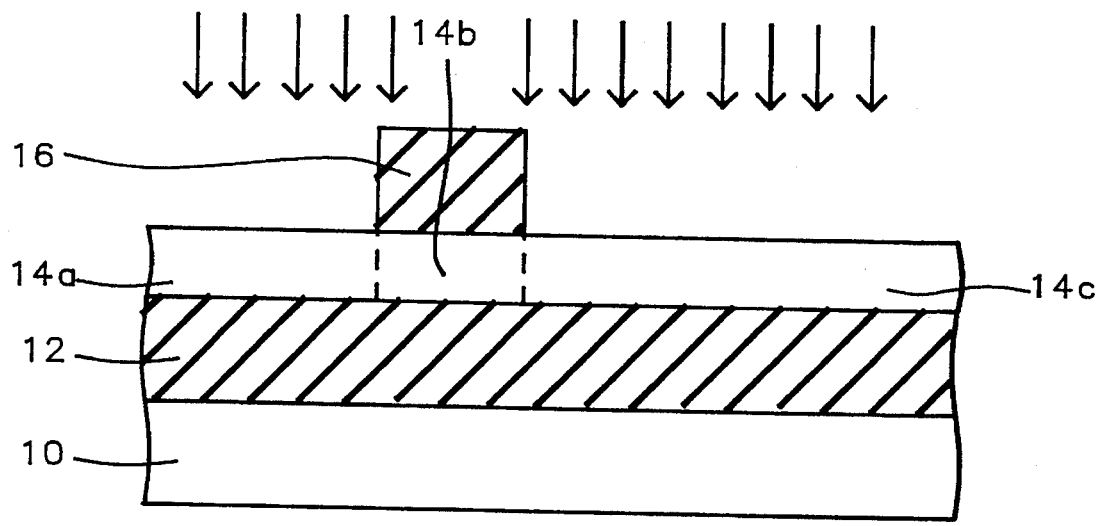
FIG. 1a - Prior Art
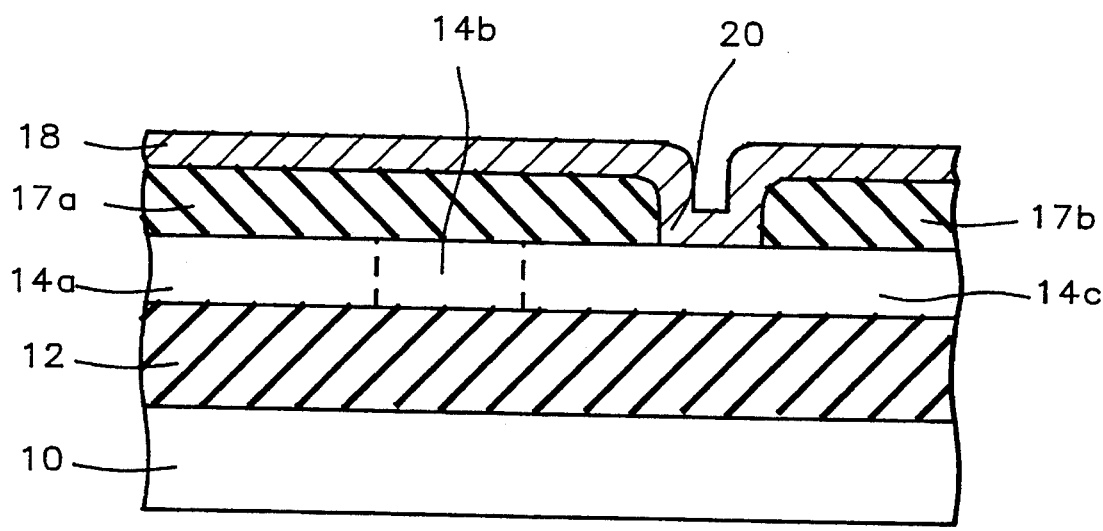
FIG. 1b - Prior Art

HIGH RESISTANCE POLYSILICON RESISTOR FOR INTEGRATED CIRCUITS AND METHOD OF FABRICATION THEREOF

BACKGROUND OF THE INVENTION

1. Field of the Invention

The present invention relates generally to resistors formed within and upon semiconductor integrated circuit substrates. More particularly, the present invention relates to a high resistivity multi-layer polysilicon resistor for use within semiconductor integrated circuit device cells of limited dimension.

2. Description of Related Art

In addition to the use of transistors and diodes as switching elements and current rectifying devices in semiconductor integrated circuits, it is also quite common in the art that those circuits will have resistors incorporated into their designs and fabrications. Commonly, a resistor structure within an integrated circuit will provide an electrical load which assures proper operation of the circuit under the electrical current and voltage parameters to which the circuit was designed.

There are several methods and materials through which resistors may be designed and fabricated into semiconductor integrated circuits. A common traditional method is to fabricate resistors within the silicon semiconductor substrate of an integrated circuit. Resistors of varying resistance can easily be fabricated within such semiconductor substrates by means of doping the semiconductor substrate through an ion implantation process similar to the ion implantation process used in forming other active semiconductor regions within the same semiconductor substrate. The practice of forming resistors through implanting dopant ions into semiconductor substrates is a viable technique unless resistors are required whose resistance exceeds the resistance of the semiconductor substrate within which the resistor is desired to be fabricated.

An alternate method which provides resistors of greater or equal resistance to resistors formed within semiconductor substrates is to form resistors from discrete portions of a high resistivity material which is deposited upon the surface of the lower resistivity semiconductor substrate. A common high resistivity material which is useful in forming these higher resistance resistors is undoped or lightly doped polysilicon. While it is known in the art that highly doped polysilicon is an excellent conductor from which conductive structures within integrated circuit devices may be fabricated, it is also well known that undoped or lightly doped polysilicon is a highly resistive material.

When formed from a high resistivity material such as undoped or lightly doped polysilicon, the resistance of a polysilicon resistor may be determined from straightforward considerations. Specifically, the resistance of the polysilicon resistor is nominally directly related to the length of the polysilicon layer from which the resistor is formed and nominally inversely related to the cross-sectional area of the polysilicon layer from which the resistor is formed. For resistors formed via planar thin film polysilicon processes within integrated circuits, the resistance of the polysilicon resistor is nominally inversely related to the thickness and the width of the polysilicon layer from which the resistor is formed.

Cross-sectional diagrams illustrating the formation of a typical polysilicon resistor within an integrated circuit are shown in FIG. 1a and FIG. 1b. Within FIG. 1a there is shown a semiconductor substrate 10 upon which there is formed a first insulating layer 12. Upon the first insulating layer 12 is formed a blanket polysilicon layer which is comprised of polysilicon layers 14a, 14b and 14c. The polysilicon layer 14b which resides beneath a patterned photoresist layer 16 forms a polysilicon resistor. The polysilicon layers 14a and 14c are typically subsequently heavily doped through the process of ion implantation to form conductive doped polysilicon ends to the polysilicon resistor which is formed from the polysilicon layer 14b.

FIG. 1b shows a continuation of the fabrication of the integrated circuit within which the polysilicon resistor illustrated in FIG. 1a is formed. Shown in FIG. 1b are patterned second insulating layers 17a and 17b formed upon the exposed surfaces of the polysilicon layers 14a, 14b and 14c after the patterned photoresist layer 16 has been removed. Between the patterned second insulating layers 17a and 17b resides an aperture at the bottom of which is the surface of polysilicon layer 14c. Finally, there is formed upon the exposed surfaces of the patterned second insulating layers 17a and 17b and into the aperture between those two insulating layers a conductor layer 18. The conductor layer 18 makes contact with the polysilicon layer 14c through a conductor/polysilicon contact 20.

As semiconductor technology has advanced, conflicting trends have evolved which require resistors of increased resistance while simultaneously providing diminished semiconductor substrate surface area upon which those resistors may be fabricated. In addition, the thickness of polysilicon layers from which are formed high resistance resistors in integrated circuit devices is nearing the limits with which current semiconductor equipment may efficiently and reproducibly deposit those layers.

Thus, the problem to which the present invention is directed is defining a more efficient high resistance polysilicon resistor structure and its method of fabrication within semiconductor integrated circuits. The desired high resistance polysilicon resistor structure will provide a resistor of sufficiently limited surface area to efficiently use semiconductor substrate surface area available to the resistor. The desired method by which the high resistance polysilicon resistor is formed will not unduly challenge established semiconductor manufacturing processes and process limitations.

Methods for providing variable resistances within polysilicon films formed upon silicon substrates are known in the art. For example, Graeger, et al. in U.S. Pat. No. 5,164,338 describes a method of manufacturing doped polysilicon resistive layers upon silicon substrates for use in pressure sensing devices. The Graeger disclosure describes a two-layered fabrication of doped polysilicon layers upon a silicon substrate. The individual layers are formed of doped polysilicon having differing polysilicon grain sizes. When used within a pressure sensing device, the disclosed fabrication provides a sensor exhibiting increased sensitivity to minute pressure changes.

Not disclosed within the art is a static high resistivity polysilicon resistor of substantially higher resistance than is common in the art. Nor is there disclosed in the art a method by which the resistance of a polysilicon resistor of limited thickness and surface area may be increased without increasing the length or decreasing the thickness of the polysilicon resistor.

SUMMARY OF THE INVENTION

A first object of the present invention is to provide a polysilicon resistor within a semiconductor integrated circuit, which resistor possesses a higher resistance than conventional polysilicon resistors known in the art.

A second object of the present invention is to provide a polysilicon resistor in accord with the first object of the present invention, the dimensional area and thickness of which resistor are to be consistent with advanced polysilicon resistors known in the art.

A third object of the present invention is to provide a polysilicon resistor in accord with the first and second objects of the present invention, which resistor is readily manufacturable with currently available semiconductor fabrication tooling.

In accord with the objects of the present invention, a new high resistance polysilicon resistor for use within semiconductor integrated circuits is described along with its method of manufacture. The polysilicon resistor is formed through depositing directly upon an insulating layer a first polysilicon layer at a first deposition temperature, the insulating layer having previously been formed upon a semiconductor substrate. A minimum of a second polysilicon layer is then deposited directly upon the first polysilicon layer. The second polysilicon layer is deposited at a second deposition temperature. The second deposition temperature is not equal to the first deposition temperature. The first deposition temperature and the second deposition temperature differ sufficiently in temperature such that a high resistivity polysilicon resistor may be formed from an overlapping portion of the first polysilicon layer and the second polysilicon layer.

Polysilicon resistors formed through the method of the present invention exhibit resistances substantially in excess of the resistances of polysilicon resistors formed from single layers of polysilicon of equivalent thickness formed within similar temperature ranges.

Polysilicon resistors formed through the method of the present invention are readily manufacturable. The resistor of the present invention is manufactured through a change in the deposition temperature for at least one of the multiple polysilicon layers from which the high resistivity polysilicon resistor of the present invention is formed. No additional fabrication equipment is needed in order to manufacture the resistor of the present invention. Nor does the method of the present invention require any substantial additional manufacturing time in comparison with the manufacturing time needed to fabricate polysilicon resistors which are known in the art. The only additional time needed to manufacture the polysilicon resistor of the present invention is the time needed to adjust the temperature from the first deposition temperature to the second deposition temperature or a subsequent deposition temperature for the plurality of polysilicon layers from which is formed the polysilicon resistor of the present invention.

BRIEF DESCRIPTION OF THE DRAWINGS

The accompanying drawings, which form a material part of this disclosure, show the following:

FIG. 1a and FIG. 1b show schematic cross-sectional views of a polysilicon resistor of the prior art formed within an integrated circuit.

DETAILED DESCRIPTION OF THE PREFERRED EMBODIMENT

The present invention differs significantly from conventional methods for forming polysilicon resistors within integrated circuit devices. The present invention provides a multi-layer polysilicon resistor which in comparison with single layer polysilicon resistors conventional to the art has significantly higher resistance for equivalent polysilicon resistor dimensional area and thickness. The higher resistance levels of polysilicon resistors of the present invention are desirable in semiconductor integrated circuits having limited dimensions.

Within the multi-layered polysilicon resistor of the present invention, the individual polysilicon layers are formed at different temperatures. While the mechanism by which temperature affects the polysilicon layers of the present invention is not well understood, it is nonetheless clear that the multi-layer polysilicon resistor of the present invention provides substantial increases in resistance in comparison with single layer polysilicon resistors of the conventional art formed within similar temperature ranges and having equivalent thicknesses and dimensional areas.

The polysilicon resistor of the present invention may be used in any integrated circuit where there is needed the high resistance achievable by the polysilicon resistor of the present invention within a limited dimensional area. Polysilicon resistors formed through the method of the present invention may be used in integrated circuits including but not limited to Dynamic Random Access (DRAM) integrated circuits, Static Random Access (SRAM) integrated circuits, bipolar integrated circuits and field effect transistor integrated circuits.

Figure 2A:
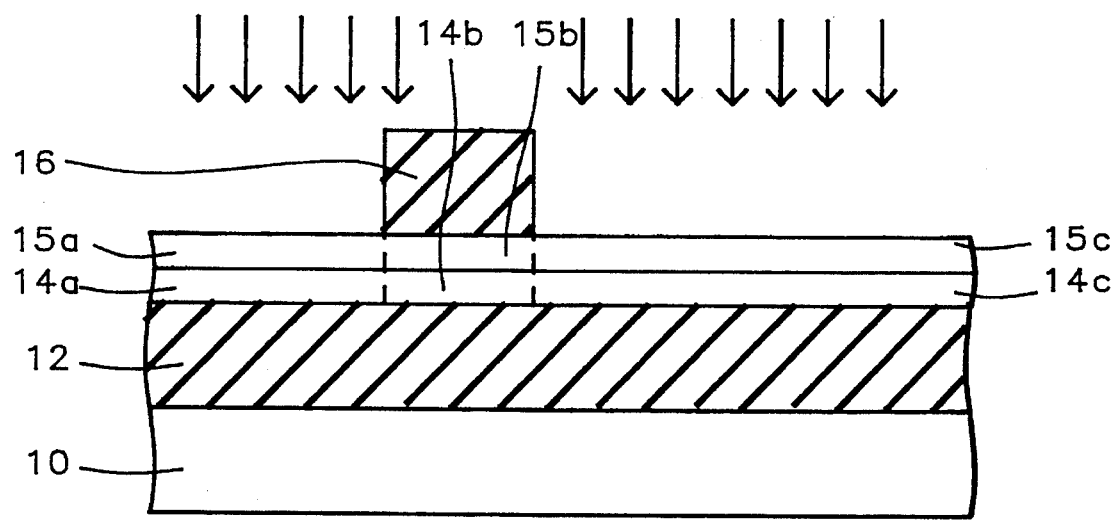
FIG. 2a and FIG. 2b show schematic cross-sectional views of a high resistance polysilicon resistor of the present invention formed within an integrated circuit.

Referring now to FIG. 2a, there is shown a cross-sectional schematic diagram which illustrates a semiconductor substrate 10 upon which is formed a polysilicon resistor in accord with the preferred embodiment of the present invention. The semiconductor substrate 10 upon which is formed the polysilicon resistor of the present invention may have any type or concentration of doping, or any crystallographic orientation. Typically, the semiconductor substrate 10 upon which is formed the polysilicon resistor of the present invention will have a (100) crystallographic orientation and either an N- or P- doping type and concentration.

Formed upon the semiconductor substrate 10 is a first insulating layer 12. The first insulating layer 12 provides the surface upon which the polysilicon resistor of the present invention is formed. Insulating layers are well known in the art. They may be formed from various materials, including but not limited to silicon oxides and silicon nitrides. Insulating layers may also be formed through several techniques as are known in the art, including but not limited to Chemical Vapor Deposition (CVD) techniques, Plasma Enhanced Chemical Vapor Deposition (PECVD) techniques and Physical Vapor Deposition (PVD) techniques.

For the preferred embodiment of the present invention, the first insulating layer 12 is preferably formed from a silicon oxide material deposited upon the semiconductor substrate 10 through a Chemical Vapor Deposition (CVD) process employing Tetra Ethyl Ortho Silicate (TEOS) as the silicon source material. The first insulating layer 12 will preferably have a thickness of about 300 to about 800 angstroms.

Once the first insulating layer 12 has been formed upon the semiconductor substrate 10, the critical processes in forming the high resistance polysilicon resistor of the present invention may proceed. The high resistance polysilicon resistor of the present invention is formed from a minimum of two layers of polysilicon which immediately adjoin each other. The individual polysilicon layers are formed at different temperatures. For the preferred embodiment of the present invention, two polysilicon layers are formed upon the surface of the first insulating layer 12. As shown in FIG. 2a, the first polysilicon layer is comprised or first polysilicon layers 14a, 14b and 14c. The first polysilicon layer is formed directly upon the first insulating layer 12. The second polysilicon layer is comprised of second polysilicon layers 15a, 15b and 15c. The second polysilicon layer is formed directly upon the first polysilicon layer.

Methods for forming polysilicon layers are well known in the art. Such layers may be formed from various silicon source materials. Typical silicon source materials from which are formed polysilicon layers include but are not limited to silane, disilane and silicon chloride. Polysilicon layers may be formed from such silicon source materials through various processes as are known in the art, including but not limited to Chemical Vapor Deposition (CVD) processes and Plasma Enhanced Chemical Vapor Deposition (PECVD) processes. For both the first polysilicon layers 14a, 14b and 14c and the second polysilicon layers 15a, 15b and 15c of the preferred embodiment of the present invention, the polysilicon layers are preferably formed from disilane or silane as the silicon source material through a Low Pressure Chemical Vapor Deposition (LPCVD) deposition process. When using disilane as the preferred silicon source material, the preferred process parameters are: (1) disilane flow rate of about 75 to about 85 standard cubic centimeters per minute (sccm), (2) nitrogen background gas flow rate of about 210 to about 230 sccm, and (3) reaction chamber pressure of about 0.15 to about 0.25 torr.

In addition to the thicknesses of the first polysilicon layers 14a, 14b and 14c and the second polysilicon layers 15a, 15b and 15c, the critical parameters which provide the high resistance polysilicon resistor of the present invention are the temperatures at which the first polysilicon layers 14a, 14b and 14c and the second polysilicon layers 15a, 15b and 15c of the present invention are formed. In particular, the difference in temperature between those two temperatures is critically important.

For the preferred embodiment of the present invention, the first polysilicon layers 14a, 14b and 14c are preferably formed upon the first insulating layer 12 at a temperature of about 450 to about 620 degrees centigrade and a thickness of about 50 to about 5000 angstroms. Most preferably, the first polysilicon layers 14a, 14b and 14c are formed upon the first insulating layer 12 at a temperature of about 455 to about 465 degrees centigrade and a thickness of about 140 to about 160 angstroms.

For the preferred embodiment of the present invention, the second polysilicon layers 15a, 15b and 15c are preferably formed upon the first polysilicon layers 14a, 14b and 14c at a temperature of about 450 to about 620 degrees centigrade and a thickness of about 50 to about 5000 angstroms. Most preferably, the second polysilicon layers 15a, 15b and 15c are preferably formed upon the first polysilicon layers 14a, 14b and 14c at a temperature of about 505 to about 515 degrees centigrade and a thickness of about 140 to about 160 angstroms.

Preferably, the difference in temperature between which the first polysilicon layers 14a, 14b and 14c are formed upon the first insulating layer 12 and the second polysilicon layers 15a, 15b and 15c are formed upon the first polysilicon layers 14a, 14b and 14c is preferably at least 10 degrees centigrade. Most preferably, the difference in temperature is at least 20 degrees centigrade.

After the second polysilicon layers 15a, 15b and 15c have been formed upon the first polysilicon layers 14a, 14b and 14c, the first polysilicon layers 14a, 14b and 14c and the second polysilicon layers 15a, 15b and 15c of the present invention preferably receive a light doping through exposure to a low dose ion implantation process in order to adjust the resistance of the polysilicon resistor of the present invention. The use of a low dose ion implantation process may be optional in situations where polysilicon resistors of very high resistance are needed.

Low dose ion implantation processes for doping silicon semiconductor substrates and polysilicon layers are known in the art. Such processes include the acceleration and implantation of dopant ions into the silicon substrate or polysilicon layer. Dopant ions which are applicable to low dose ion implantation processes include but are not limited to boron ions, boron difluoride ions, arsenic ions and phosphorus ions. For the preferred embodiment of the present invention, the preferred dopant ions are boron difluoride ions implanted into the first polysilicon layers 14a, 14b and 14c and the second polysilicon layers 15a, 15b and 15c at an ion implantation dose of about 4.5E12 to about 5.5E12 ions per square centimeter and an ion implantation energy of about 19 to about 21 keV.

After the first polysilicon layers 14a, 14b and 14c and the second polysilicon layers 15a, 15b and 15c have been implanted with a low dose ion implant, a patterned photoresist layer 16 is formed upon the surface of polysilicon layer 15b. The patterned photoresist layer 16 is formed through methods as are conventional to the art. The patterned photoresist layer 16 serves as a mask to protect from the next processing operation the first polysilicon layer 14b and the second polysilicon layer 15b which polysilicon layers form the polysilicon resistor of the present invention.

The next process step of the preferred embodiment of the present invention is provide a high dose ion implant into the first polysilicon layers 15a and 15c and the second polysilicon layers 14a and 14c, using as a mask the photoresist layer 16. Upon completion of the high dose ion implant there are formed conductive ends to the polysilicon resistor which is formed from the first polysilicon layer 14b and the second polysilicon layer 15b. The conductive ends are formed respectively from the second polysilicon layer 15a and the first polysilicon layer 14a, and the second polysilicon layer 15c and the first polysilicon layer 14c.

The methods and materials for providing the high dose ion implant which forms the conductive ends to the polysilicon resistor of the present invention are analogous to the methods and materials through which low dose ion implant was provided to the second polysilicon layers 15a, 15b and 15c and the first polysilicon layers 14a, 14b and 14c. Specifically, high dose ion implants may be provided through implanting with ions including but not limited to arsenic ions, boron ions, boron difluoride ions or phosphorus ions. For the preferred embodiment of the present invention, the high dose ion implant for forming the conductive ends to the polysilicon resistor of the present invention is preferably provided through implanting boron ions, boron difluoride ions, arsenic ions or phosphorus ions at about 1E14 to about 1E16 ions per square centimeter ion implantation dose and about 10 to about 200 keV ion implantation energy. Most preferably, the high dose ion implant is preferably provided through a boron difluoride ion implant at about 9E14 to about 11E14 ions per square centimeter ion implantation dose and about 24 to about 26 keV ion implantation energy.

After the end portions of the high resistance resistor of the present invention have been made conductive through a high dose ion implantation with boron difluoride ion, the patterned photoresist layer 16 may be removed from the surface of the polysilicon layer 15b.

Figure 2B:
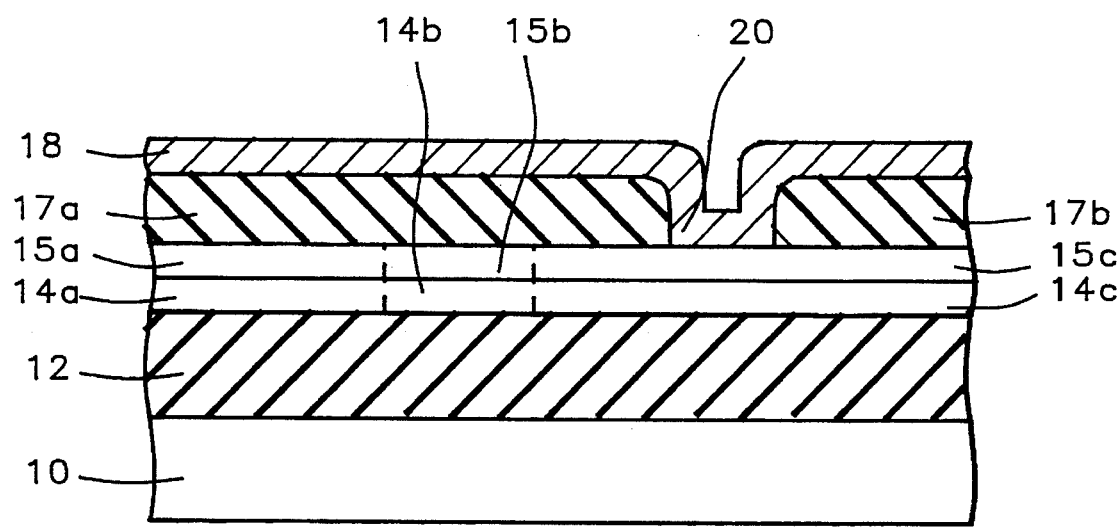

Referring now to FIG. 2b there is shown the last series of process steps in accord with the preferred embodiment of the present invention. Shown in FIG. 2b is the semiconductor substrate 10 illustrated in FIG. 2a from which has been removed the patterned photoresist layer 16. Methods for removing photoresist layers from semiconductor substrates are conventional to the art. Such methods include, but are not limited to wet chemical etch methods and dry plasma etching methods.

Subsequent to removing the patterned photoresist layer 16, there is formed upon the surfaces of the second polysilicon layers 15a, 15b and 15c patterned second insulating layers 17a and 17b. The methods and materials through which the patterned second insulating layers 17a and 17b are formed upon the second polysilicon layers 15a, 15b and 15c are analogous to the methods and materials through which the first insulating layer 12 is formed upon the semiconductor substrate 10. Specifically, the patterned second insulating layers 17a and 17b are formed through patterning of a blanket second insulating layer formed upon the semiconductor substrate. Analogously to the first insulating layer 12, the blanket second insulating layer may be formed from various insulating materials known in the art, including but not limited to silicon oxides and silicon nitrides. The blanket second insulating layer may be deposited through several techniques as are known in the art, including but not limited to Chemical Vapor Deposition (CVD) techniques, Plasma Enhanced Chemical Vapor Deposition (PECVD) techniques and Physical Vapor Deposition (PVD) techniques.

For the preferred embodiment of the present invention, the blanket second insulating layer is preferably formed from a silicon oxide material deposited upon the second polysilicon layers 15a, 15b and 15c through a Chemical Vapor Deposition (CVD) process employing Tetra Ethyl Ortho Silicate (TEOS) as the silicon source material. The blanket second insulating layer will preferably have a thickness of about 300 to about 800 angstroms. The blanket second insulating layer is then patterned into the patterned second insulating layers 17a and 17b through photo-masking and etching techniques as are conventional in the art. For the preferred embodiment of the present invention, the blanket second insulating layer is preferably patterned through an anisotropic Reactive Ion Etch (RIE) etching of portions of the blanket second insulating layer exposed through a photomask. Within FIG. 2b, the patterning of the blanket second insulating layer to form the patterned second insulating layers 17a and 17b yields an aperture between patterned second insulating layers 17a and 17b at the bottom of which aperture resides the surface of the second polysilicon layer 15c.

Finally, there is shown in FIG. 2b a conductor layer 18 which is formed upon the surfaces of the patterned second insulating layers 17a and 17b and into the aperture between those layers. Contact between the conductor layer 18 and the polysilicon layer 15c is made through the conductor/polysilicon contact 20 at the bottom of the aperture between the patterned second insulating layers 17a and 17b.

The conductor layer 18 may be formed through methods and materials which are common to the art. Commonly, conductor layers within integrated circuits are comprised of thick conductor metallization layers above and/or below which are formed barrier metallization layers. Conductor metallization layers are typically formed from conductors including but not limited to aluminum, aluminum alloys and copper. Barrier metallization layers are typically formed from materials including but not limited to titanium, titanium nitride and titanium tungsten alloy. Both conductor metallization layers and barrier metallization layers may be formed through methods known in the art, including but not limited to thermal evaporation methods, electron beam assisted evaporation methods, Chemical Vapor Deposition (CVD) methods and Physical Vapor Deposition (PVD) sputtering methods. For the preferred embodiment of the present invention, the conductor layer 18 will typically include at least one barrier metallization layer residing beneath and/or above a conductor metallization layer.

Upon forming the conductor layer 18 upon the patterned second insulating layers 17a and 17b of the present invention, there is formed a polysilicon resistor of the present invention within an integrated circuit.

Figure 3:
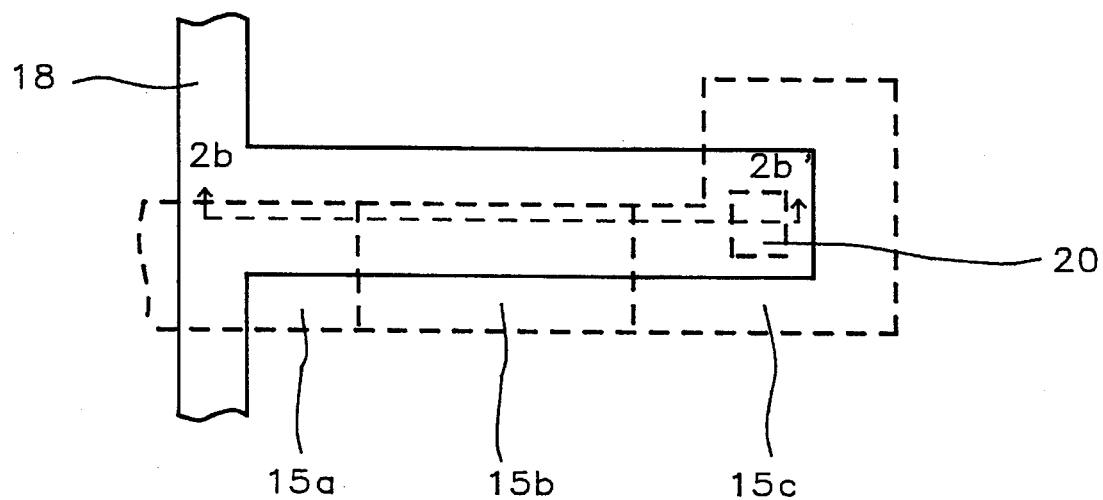
FIG. 3 shows a schematic plan-view of a high resistance polysilicon resistor of the present invention formed within an integrated circuit.

Referring now to FIG. 3, there is shown a schematic plan-view diagram of the high resistivity polysilicon resistor of the present invention, and the adjoining portions of the integrated circuit to which the resistor is connected. FIG. 3 corresponds to the cross-sectional diagram shown in FIG. 2b. FIG. 3 shows exposed conductor layer 18 which makes contact to the underlying second polysilicon layer 15c through conductor/polysilicon contact 20. The polysilicon resistor of the present invention is formed from first polysilicon layer 14b and second polysilicon layer 15b. The first polysilicon layer 14a and the second polysilicon layer 15a form one end of the polysilicon resistor. The first polysilicon layer 14c and the second polysilicon layer 15c to which contact to conductor layer 18 is made through conductor/polysilicon contact 20 form the other end of the polysilicon resistor.

EXAMPLE 1

A series of 224 interconnected polysilicon resistors comprising a polysilicon resistor test pattern was formed upon a semiconductor substrate in accord with the cross-sectional diagrams shown in FIG. 1a and FIG. 1b. The series of resistors was formed upon a first silicon oxide insulating layer which resided upon the semiconductor substrate. The resistors were formed from a single 300 angstrom thick blanket polysilicon layer formed upon the first silicon oxide layer at a temperature of 480 degrees centigrade. The blanket polysilicon layer was formed through a Chemical Vapor Deposition (CVD) process employing disilane as the silicon source material at a flow rate of 80 sccm and nitrogen as a background gas at a flow rate of 220 sccm. Under these conditions, the deposition time to form the 300 angstrom thick polysilicon layer was 25 minutes.

The blanket polysilicon layer was then exposed to a low dose ion implant employing boron difluoride dopant ions at about 5E12 ions per square centimeter dose and about 20 keV ion implantation energy. The blanket polysilicon layer was then patterned to form 224 individual polysilicon layers from which were formed the polysilicon resistors of the polysilicon resistor test pattern. The individual polysilicon layers were then masked with a patterned photoresist covering a dimensional area of 0.6 microns in width and 2.0 microns in length of each of the 224 individual polysilicon layers. Beneath the patterned photoresist resided the 224 polysilicon resistors. The unmasked portions of the polysilicon layers were then implanted with a high dose ion implant to form conductive polysilicon ends to the polysilicon resistors which resided beneath the patterned photoresist layer. The high dose ion implant was undertaken using boron difluoride ions at about 1E15 ions per square centimeter dose and about 25 keV ion implantation energy.

Subsequent to implanting the boron difluoride ions into the end portions of the resistors, the patterned photoresist layer was removed. Upon the surface of the semiconductor substrate was then formed a patterned second insulating layer having apertures formed therethrough which provided access to the doped ends of the polysilicon resistors. Upon the patterned second insulating layer was formed a patterned conductor layer which shunted together the 224 resistors. The resistance of the 224 shunted resistors was then measured at an applied potential of 3.3 volts. From the measured resistance of the 224 polysilicon resistors shunted together was then calculated the sheet resistance of the polysilicon resistors by means of the following equation:

Sheet Resistance=Measured Resistance (224/(2.0/0.6)).

The calculated sheet resistance is reported in TABLE I.

EXAMPLES 2–3

Two additional series of 224 polysilicon resistors were formed into two additional polysilicon resistor test patterns upon two additional semiconductor substrates. The two series were formed in a fashion equivalent to the series of 224 polysilicon resistors formed in EXAMPLE 1 with the exception that the polysilicon resistors of EXAMPLES 2–3 were not formed from a single layer of polysilicon deposited at 300 angstroms thickness and a temperature of 480 degrees centigrade. Rather, in both EXAMPLE 2 and EXAMPLE 3 the polysilicon resistors were formed from two layers of polysilicon.

In EXAMPLE 2, the first layer of polysilicon was about 150 angstroms thick and it was formed at 460 degrees centigrade. Using the polysilicon deposition conditions outlined in EXAMPLE 1, the deposition time for this polysilicon layer was 18 minutes and 11 seconds. Formed immediately upon the first layer was a second layer of polysilicon which was also about 150 angstroms thick. The second polysilicon layer was formed at a temperature of about 510 degrees centigrade. Using the polysilicon deposition conditions of EXAMPLE 1, the deposition time for this polysilicon layer was 3 minutes and 40 seconds. The resistance of the resistors formed through the method of EXAMPLE 2 was calculated according to the method outlined in EXAMPLE 1. The calculated value is reported in TABLE I.

In EXAMPLE 3 there was formed a polysilicon resistor test pattern analogous to the polysilicon resistor test pattern of EXAMPLE 2 with the exception that the temperatures at which the two polysilicon layers of the were formed were reversed. In EXAMPLE 3, the first polysilicon layer was formed upon the first silicon oxide insulating layer at a temperature of about 510 degrees centigrade and a thickness of about 150 angstroms. The second polysilicon layer was formed upon the first polysilicon layer at a temperature of about 460 degrees centigrade and a thickness of about 150 angstroms. The deposition times for these polysilicon layers correspond to the deposition times for the equivalent layers provided in EXAMPLE 2. The result for the calculated sheet resistance of the resistors of EXAMPLE 3 is also reported in TABLE I.

TABLE I

| EXAMPLE | POLY-Si DEPOSITION CONDITIONS | SHEET RESISTANCE (at 3.3 Volts) |
| --- | --- | --- |
| 1 | 300 A at 480 C. | 3.7E9 ohm/sq |
| 2 | 150 A at 460 C./150 A at 510 C. | 86.6E9 ohm/sq |
| 3 | 150 A at 510 C./150 A at 460 C. | 66.6E9 ohm/sq |

From review of the data of TABLE I it is clear that polysilicon resistors formed from multiple layers of polysilicon deposited at different temperatures provide polysilicon resistors of significantly higher resistance than polysilicon resistors of equivalent dimensions formed form a single layer of equivalent thickness of polysilicon deposited at a single temperature.

What is claimed is:

1. A multi-layer polysilicon resistor for use within an integrated circuit comprising:

a first polysilicon layer formed over an insulating layer upon a semiconductor substrate, the first polysilicon layer being formed at a first deposition temperature;

a minimum of a second polysilicon layer formed directly upon the first polysilicon layer, the second polysilicon layer being formed at a second deposition temperature, where the first deposition temperature and the second deposition temperature are in the range of from 450 to 620 degrees centigrade and the difference in temperature between the first deposition temperature and the second deposition temperature is greater than 10 degrees centigrade whereby there is formed a multi-layer polysilicon resistor of higher resistance than a single layer polysilicon resistor of equivalent aggregate thickness.

2. The resistor of claim 1 wherein the first polysilicon layer is about 50 to about 5000 angstroms thick.

3. The resistor of claim 1 wherein the second polysilicon layer is about 50 to about 5000 angstroms thick.

4. The resistor of claim 1 wherein the first polysilicon layer is formed at a higher temperature than the second polysilicon layer.

5. The resistor of claim 1 wherein the second polysilicon layer is formed at a higher temperature than the first polysilicon layer.

6. The resistor of claim 1 further comprising a pair of conductive ends of the resistor, the conductive ends being formed through implanting a high dose of dopant ions into portions of the second polysilicon layer and the first polysilicon layer employing as a mask a patterned photoresist layer formed upon the surface of the second polysilicon layer.

7. A method for forming a multi-layer polysilicon resistor within an integrated circuit comprising:

forming an insulating layer upon a semiconductor substrate;

forming a first polysilicon layer upon the insulating layer, the first polysilicon layer being formed at a first deposition temperature;

forming at minimum a second polysilicon layer directly upon the first polysilicon layer, the second polysilicon layer being formed at a second deposition temperature, where the first deposition temperature and the second deposition temperature are in the range of from 450 to 620 degrees centigrade and the difference in temperature between the first deposition temperature and the second deposition temperature is greater than 10 degrees centigrade whereby there is formed a multi-layer polysilicon resistor of higher resistance than a single layer polysilicon resistor of equivalent aggregate thickness.

8. The method of claim 7 wherein the thickness of the first polysilicon layer is about 50 to about 5000 angstroms.

9. The method of claim 7 wherein the thickness of the second polysilicon layer is about 50 to about 5000 angstroms.

10. The method of claim 7 wherein the first deposition temperature is greater than the second deposition temperature.

11. The method of claim 7 wherein the second deposition temperature is greater than the first deposition temperature.

12. The method of claim 7 wherein the first polysilicon layer and the second polysilicon layer are formed through a Chemical Vapor Deposition (CVD) process using a silicon source material chosen from the group of silicon source materials consisting of silane and disilane.

13. The method of claim 7 further comprising forming a pair of conductive doped polysilicon ends on the multi-layer polysilicon resistor.

14. The method of claim 13 wherein the pair of conductive doped polysilicon ends is formed through a high dose ion implantation process.

15. The method of claim 14 wherein the high dose ion implantation process employs a dopant ion implanted at about 1E14 to about 1E16 ions per square centimeter dose and about 10 to about 200 keV ion implantation energy, the dopant ion being chosen from the group of dopant ions consisting of arsenic ions, boron ions, boron difluoride ions and phosphorus ions.

\* \* \* \* \*